United States Patent [19]
Gabele et al.

[11] Patent Number: 5,991,521
[45] Date of Patent: Nov. 23, 1999

[54] METHOD AND SYSTEM OF CHECKING FOR OPEN CIRCUIT CONNECTIONS WITHIN AN INTEGRATED-CIRCUIT DESIGN REPRESENTED BY A HIERARCHICAL DATA STRUCTURE

[75] Inventors: Carol Ivash Gabele; Stephen Thomas Quay; Clay Chip Smith, all of Austin, Tex.

[73] Assignee: International Business Machines Corporation, Armonk, N.Y.

[21] Appl. No.: 08/829,578

[22] Filed: Mar. 31, 1997

[51] Int. Cl.⁶ ...................................................... G06F 17/50
[52] U.S. Cl. .............................. 395/500.05; 395/500.06; 324/512; 702/58; 702/59
[58] Field of Search ..................................... 364/488, 489, 364/490, 491, 578; 395/500, 500.05, 500.06; 324/512; 702/58, 59

[56] References Cited

U.S. PATENT DOCUMENTS

| | | | |
|---|---|---|---|
| 4,494,066 | 1/1985 | Goel et al. | 324/73 |
| 4,890,238 | 12/1989 | Klein et al. | 364/491 |
| 4,924,430 | 5/1990 | Zasio et al. | 364/578 |
| 5,295,081 | 3/1994 | Habra | 364/489 |
| 5,461,576 | 10/1995 | Tsay et al. | 364/490 |
| 5,496,366 | 3/1996 | Yang et al. | 364/489 |
| 5,555,201 | 9/1996 | Dangelo et al. | 364/489 |
| 5,691,991 | 11/1997 | Kessler et al. | 371/22.3 |
| 5,754,442 | 5/1998 | Minagawa et al. | 364/489 |

OTHER PUBLICATIONS

P. K. Graham, "AC Interconnect Test with Series Boundary Scan," IBM Technical Disclosure Bulletin, vol. 34 No. 6, pp. 325–330, Nov. 1991.

S. M. Douskey, "Method and Design for Applying Stuck Faults in an LSSD Boundary Scan Environment," IBM Technical Disclosure Bulletin, vol. 34 No. 10B, pp. 444–446, Mar. 1992.

Arimilli et al, "Method to Verify Chip–to–Chip Interconnect within a Hardware System," Jun. 1993.

*Primary Examiner*—Kevin J. Teska
*Assistant Examiner*—Vuthe Siek
*Attorney, Agent, or Firm*—Anthony V. S. England; Antony P. Ng; Andrew J. Dillon

[57] ABSTRACT

An integrated-circuit design is provided which is represented by a hierarchial data structure. In accordance with the method and system of the present invention, an integrated-circuit design which includes at least one parent circuit represented by a set of parent circuit level data and at least one child circuit represented by a set of child circuit level data. For an open circuit connection within the child circuit, a determination is made as to whether or not the open circuit connection is permissible. In response to a determination that the open circuit connection is permissible, another determination is made as to whether or not the number of I/O pins within the child circuit is greater than the number of open circuit connections within the child circuit. In response to a determination that the number of I/O pins within the child circuit is greater than the number of open circuit connections within the child circuit, the set of child circuit level data is integrated into the set of parent circuit level data. Finally, a determination is made as to whether or not the open circuit connection is closed within the integrated set of parent circuit level data. An error message will be displayed if the open circuit connection is not closed within the integrated set of parent circuit level data.

12 Claims, 5 Drawing Sheets

METHOD AND SYSTEM OF CHECKING FOR OPEN CIRCUIT CONNECTIONS WITHIN AN INTEGRATED-CIRCUIT DESIGN REPRESENTED BY A HIERARCHICAL DATA STRUCTURE

BACKGROUND OF THE INVENTION

1. Technical Field

The present invention relates to an improved method and system for data processing in general and, in particular, to an improved method and system for processing data related to an integrated-circuit design. Still more particularly, the present invention relates to a method and system of checking for open circuit connections within an integrated-circuit design which is implemented with a hierarchial data structure.

2. Description of the Prior Art

Development of an integrated-circuit (IC) chip is a process that involves drafting a design specification, creating a logical design of the chip from the specification (typically in schematic form), checking the design, redesigning as necessary, fabricating the chip and testing the chip. Because of the increasing chip complexity, a design methodology commonly utilized today is macro-based, hierarchical, and top-down (or bottom-up). Under the macro-based design approach, a collection of circuits that forms a function or has a high connectivity is placed and wired together to form a macro. Two or more macros may be placed and wired together to form a super-macro. Finally, all super-macros are connected to each other to form an IC chip. This macro-based approach can support many levels of circuit hierarchy. In conjunction with the hierarchical design approach, many circuits within the IC chip may be designed in parallel. This reduces the chip design turnaround-time and makes reusable macros become feasible. In addition, the hierarchical design approach also minimizes the complexity and data volume of chip design at every level of circuit hierarchy. Under the top-down design approach, the planning starts at the highest level and progresses toward lower levels of the circuit hierarchy. The upper level defines the requirements of the design for the lower levels. Once the planning is complete, the design of the higher and lower levels can start in parallel to minimize the design cycle.

After the completion of the logical and physical design of the IC chip, the result of the design must be validated. Design validation requires thorough examination of the entire IC design and expected functional characteristics, taking into account a number of different factors, such as logical correctness of the design, timing factors (including wire delay, power dissipation, effects of parasitic capacitances, etc.). Because of the complexity of the IC design, virtually all design validations are performed by semiconductor design automation systems. These semiconductor design automation systems facilitate the capture, simulation, layout, and verification of IC chip designs.

A semiconductor design automation system typically operates in a hierarchical mode, by folding a previously processed circuit level into a current circuit level. One of the specifications of an IC chip design from within a semiconductor design automation system is a "net-list" that contains a complete description of all of the devices (e.g., transistors, resistors, etc.) required and how each of the devices is connected. Specifically, each connection within the IC chip design is described in the form of a "net" (short for "network") or in the form of point-to-point wiring connections between devices. A single net may connect to many devices, and a net-list includes a list of all net interconnections, thus the name "net-list." A semiconductor design automation system analyzes each net and categorizes how each net spans the hierarchy of the total design.

With reference now to the drawings, and specifically to FIG. 1, there is illustrated a block diagram of a net of a circuit design. As shown, net 10 has two levels, namely, a parent circuit level 11 and a child circuit level 12. Looking from child circuit level 12, net 10 appears to have an "open" at connections 13 and 14. Hierarchical processing typically requires a net to be completely connected in each circuit level, so that network continuity is assured when all the pieces are brought together. Hence, child circuit level 12 of net 10 as shown in FIG. 1 will be considered as having an open circuit connection by the semiconductor design automation system.

As a general rule, any open circuit connection in a net should be flagged. However, sometimes an IC chip designer may need some flexibility to this "generic" open circuit checking rule, usually related to a routing requirement. Hence, a method is needed to somehow indicate to the semiconductor design automation system that, for a specific portion of a given hierarchical net, an open circuit connection is intended and permissible. Yet, at the same time, the design automation system must be able to catch a true open connection in the wiring of the circuit. Consequently, it would be desirable to provide an improved method and system of checking for open circuit connections within an integrated-circuit design that is represented by a hierarchial data structure.

SUMMARY OF THE INVENTION

In view of the foregoing, it is therefore an object of the present invention to provide an improved method and system for data processing.

It is another object of the present invention to provide an improved method and system for processing data related to an integrated-circuit design.

It is yet another object of the present invention to provide an improved method and system of checking for open circuit connections within an integrated-circuit design that is implemented with a hierarchial data structure.

The foregoing objects are achieved as is now described. An integrated-circuit design which includes at least one parent circuit represented by a set of parent circuit level data and at least one child circuit represented by a set of child circuit level data. For an open circuit connection within the child circuit, a determination is made as to whether or not the open circuit connection is permissible. In response to a determination that the open circuit connection is permissible, another determination is made as to whether or not the number of I/O pins within the child circuit is greater than the number of open circuit connections within the child circuit. In response to a determination that the number of I/O pins within the child circuit is greater than the number of open circuit connections within the child circuit, the set of child circuit level data is integrated into the set of parent circuit level data. Finally, a determination is made as to whether or not the open circuit connection is closed within the integrated set of parent circuit level data. An error message will be displayed if the open circuit connection is not closed within the integrated set of parent circuit level data.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

The present invention may be executed in a midrange computer or a mainframe computer under a number of different operating systems. In addition, the computer may be a standalone system or part of a network such as a local-area network (LAN) or a wide-area network (WAN). For the purpose of illustration, a preferred embodiment of the present invention, as described below, is implemented on an RS/6000™ computer, manufactured by International Business Machines Corporation.

Figure 1:
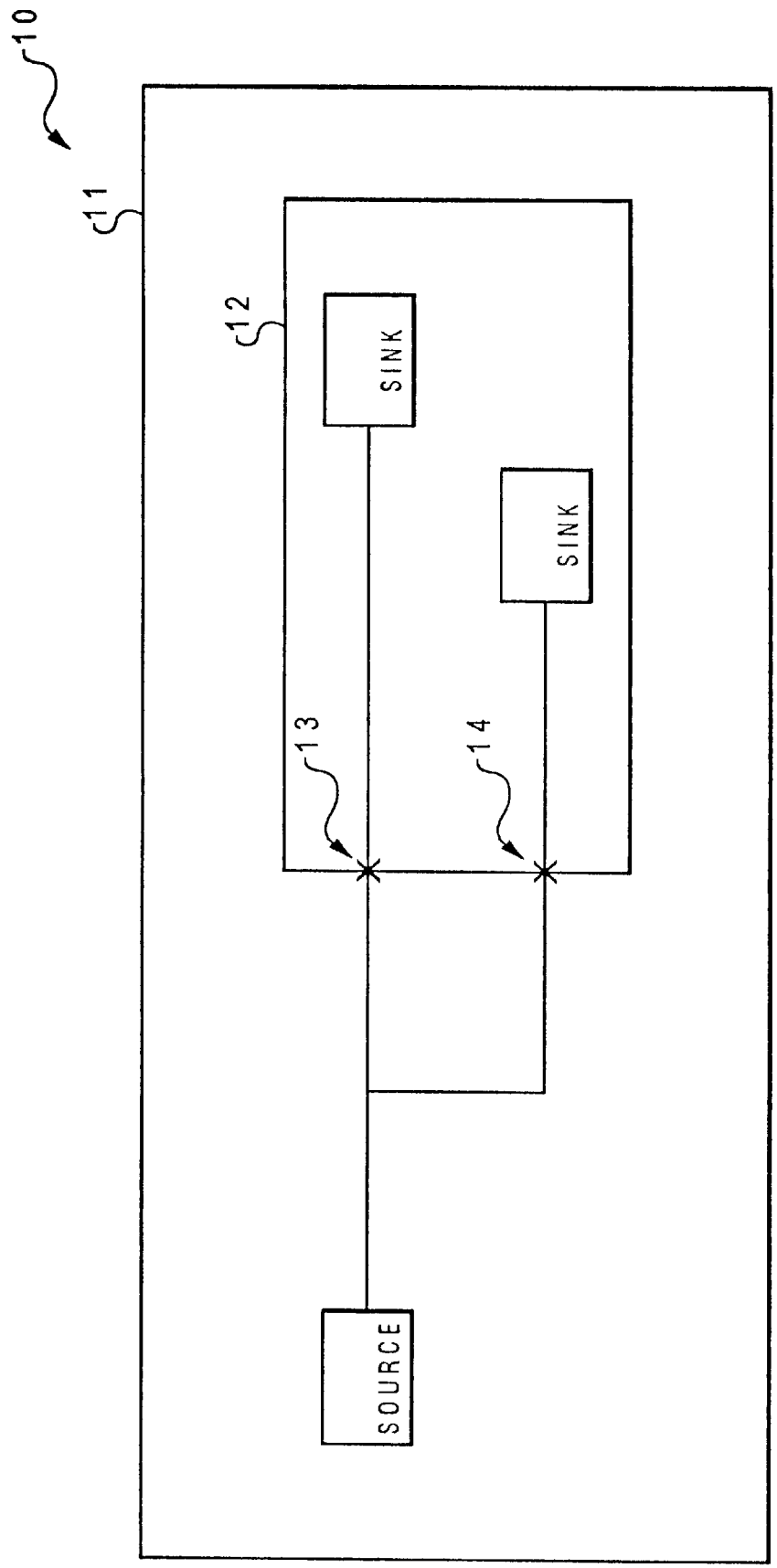
FIG. 1 is a block diagram of a net having a parent circuit and a child circuit.
Figure 2:
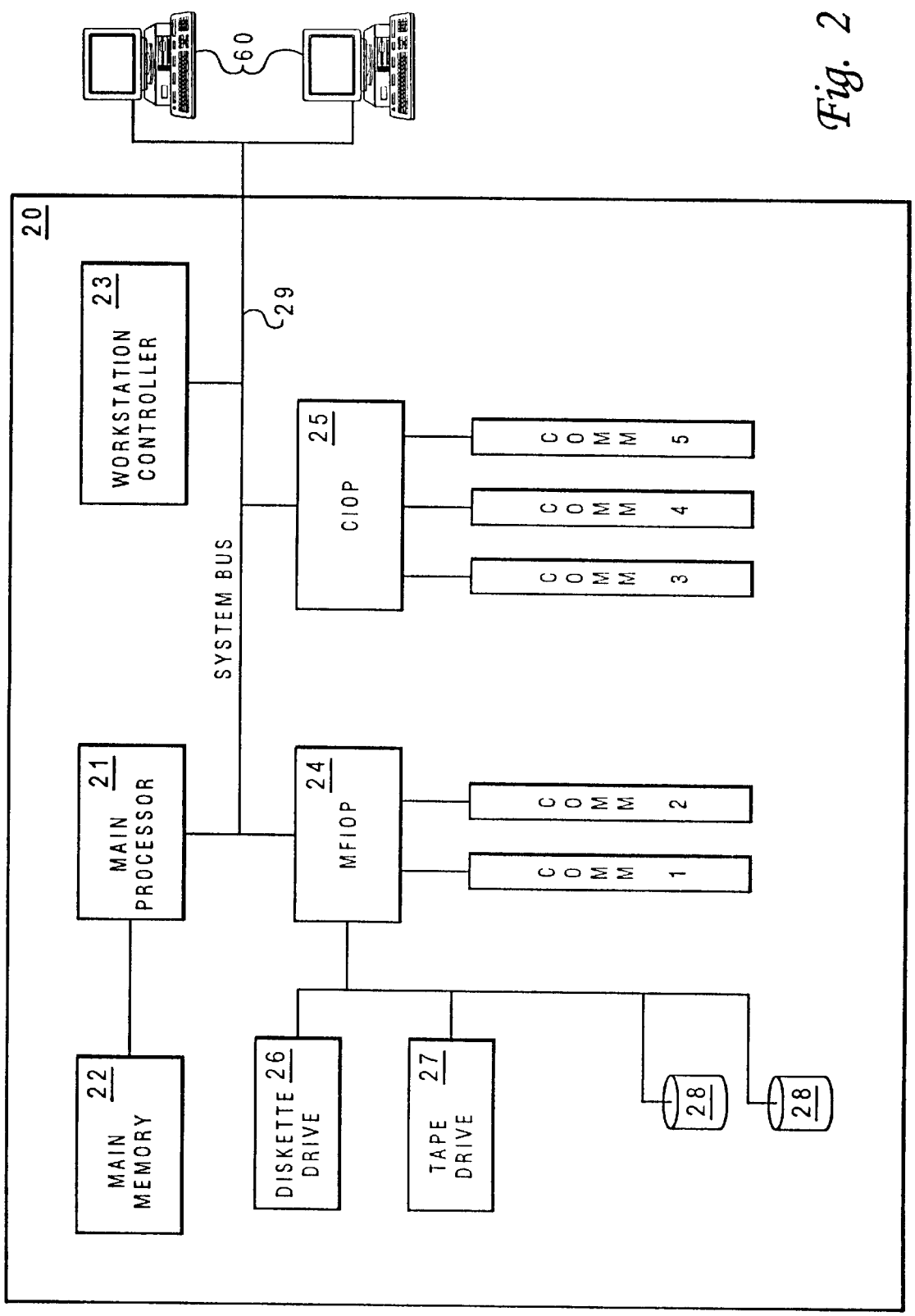
FIG. 2 is a block diagram of a computer system that may be utilized by a preferred embodiment of the invention.

With reference now to FIG. 2, there is illustrated a block diagram of a computer system that may be utilized by a preferred embodiment of the invention. Within computer box 20, main processor 21 is coupled to a main memory 22 and a multiple-function I/O processor (MFIOP) 24. Main processor 21 may include a single processor or multiple processors. Several peripheral storage devices such as diskette drive 26, tape drive 27, and direct access storage devices (DASDs) 28, are controlled by MFIOP 24. In addition, MFIOP 24 provides communications to other devices via communication ports such as COMM 1 and COMM 2.

Attached to system bus 29 are a workstation controller 23 and a communications I/O processor (CIOP) 25. Workstation controller 23 provides communications between main processor 21 and workstation(s) 60 that may be connected to the computer system. CIOP 25 provides communications to other devices via communication ports such as COMM3, COMM4, and COMM5.

According to a preferred embodiment of the present invention, each I/O pin at a circuit level within a net may be marked with a special flag. This special flag is utilized to inform the design automation system that an open connection for that particular I/O pin is permissible at a data level corresponding to that circuit level. That I/O pin is a primary I/O pin for that data level.

When a net has multiple primary I/O pins, a design automation system will consider each I/O pin as a separate logical pin and will try to force a connection to each I/O pin. With this special flag, each I/O pin is considered as just an instance of the same logical I/O pin. Only one of the instances needs to be wired to satisfy connectivity.

In spite of allowing open connections for certain I/O pins in the net as mentioned above, the ability to detect a true open connection is achieved by totalling up the number of discontinuities in a current circuit level and comparing it against the number of specially marked I/O pins in the same circuit level. According to a preferred embodiment of the present invention, the number of discontinuities must be less than or equal to the number of specially marked I/O pins. If there are more discontinuities than specially marked I/O pins, there is an unpermissible open connection in the current circuit level. This will be reported as an error.

Figure 3:
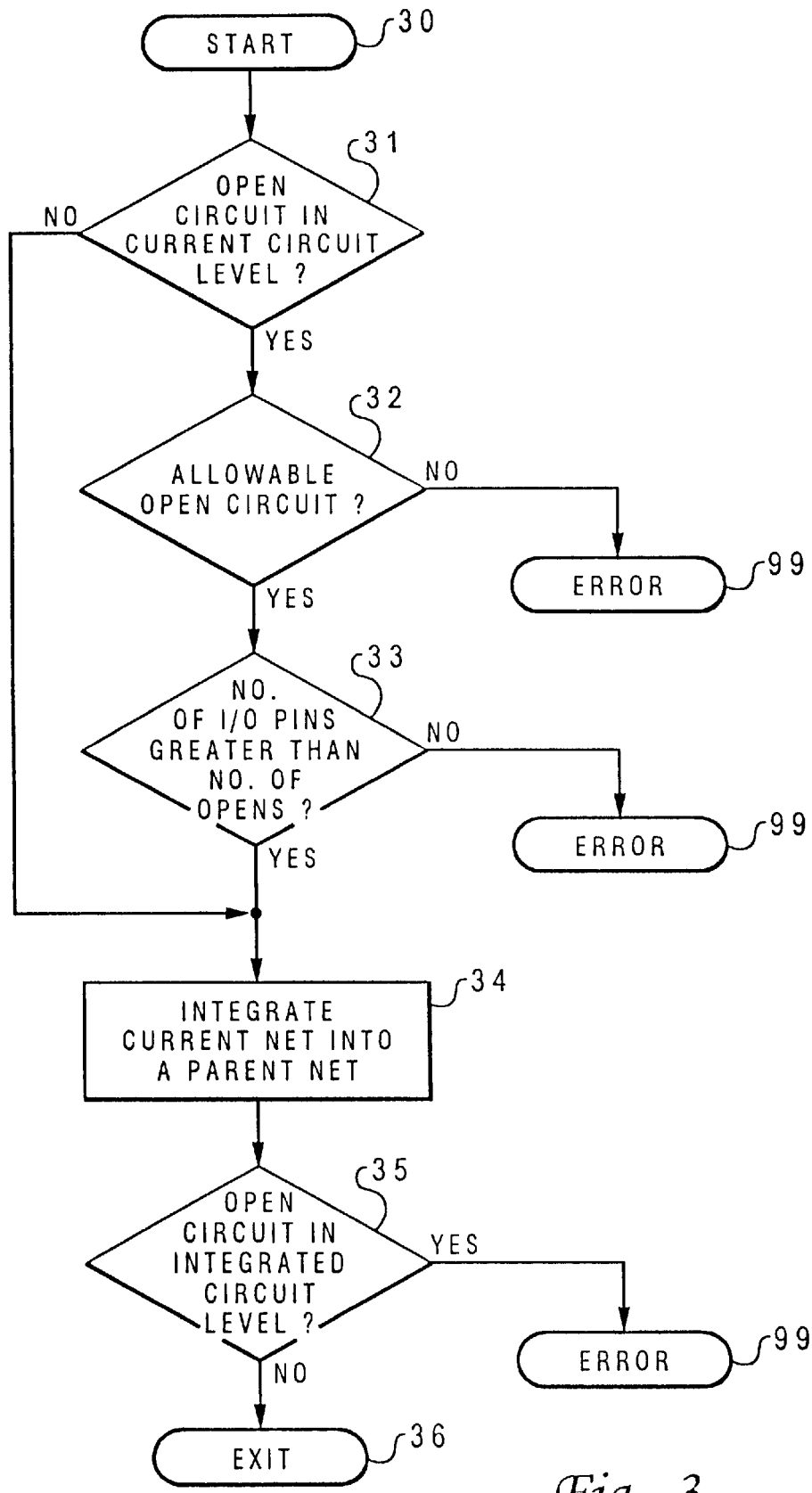
FIG. 3 is a high-level logic flow diagram of a method of checking for open circuit connections within an integrated-circuit design that is represented by a hierarchial data structure, in accordance with a preferred embodiment of the present invention.

Referring now to FIG. 3, there is illustrated a high-level logic flow diagram of a method for checking open circuit connections within an integrated-circuit design that is represented by a hierarchial data structure, in accordance with a preferred embodiment of the present invention. Starting at block 30, a determination is made as to whether or not there is an open circuit connection in the current circuit level (a child circuit level), as shown in block 31. If there is no open circuit connection, the process proceeds to block 34. Otherwise, if there is an open circuit connection, another determination is made as to whether or not the open circuit connection is allowable, as depicted in block 32. Such is indicated by a special flag within each I/O pin definition, as mentioned infra. If the open circuit connection is not allowable, an error message is displayed, as illustrated in block 99. On the contrary, if the open circuit connection is allowable, a determination is made as to whether or not the number of I/O pins is greater than the number of open circuit connections at the current circuit level, as shown in block 33. If the number of I/O pins is not greater than the number of open circuit connections at the current circuit level, an error message is displayed, as depicted in block 99.

Otherwise, if the number of I/O pins is greater than the number of open circuit connections at the current circuit level, the set of data representing the current circuit level is integrated (or flattened) into the set of data representing the parent circuit level, as illustrated in block 34. After the set of data representing the current circuit level has been integrated into the set of data representing the parent circuit level, a determination is made as to whether or not there is an open circuit connection in the integrated set of parent circuit level data, as shown in block 35. If there is an open circuit connection in the integrated set of parent circuit level data, an error message is displayed, as depicted in block 99. However, if there is no open circuit connection in the integrated set of parent circuit level data, the process exits at block 36.

Figure 4:
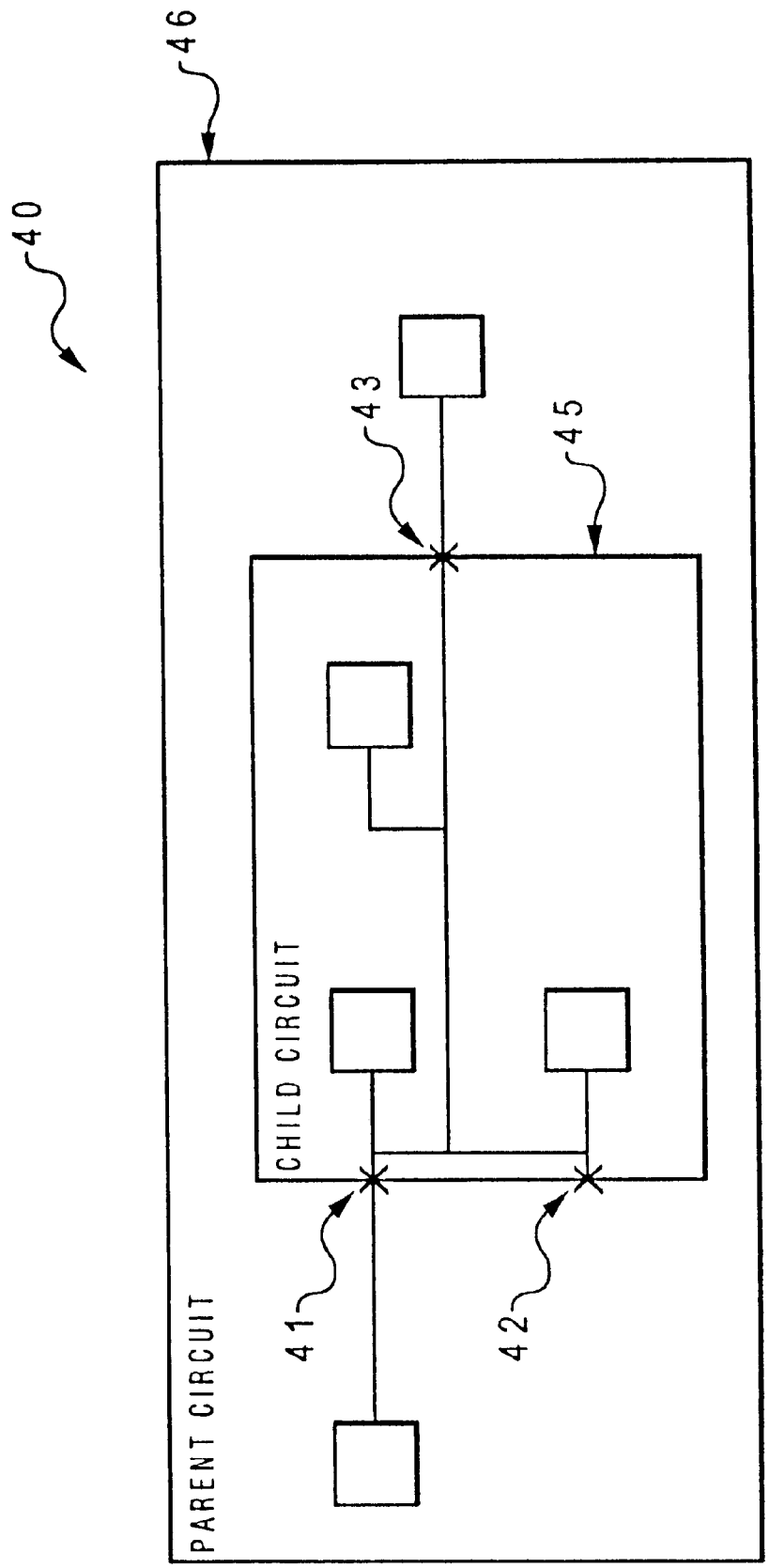
FIG. 4 is a block diagram of a net having a child circuit completely connected within the child circuit.

With reference now to FIG. 4, there is depicted a block diagram of a network having a child circuit completely connected within the child circuit. Net 40, as shown, will pass the traditional open circuit connection check as well as the improved open circuit check in accordance with the present invention, during incremental processing. Primary I/O pins 41, 42, and 43, as shown, are all the same logical pin, and child circuit 45 acts as a feed-through for parent circuit 46.

Figure 5:
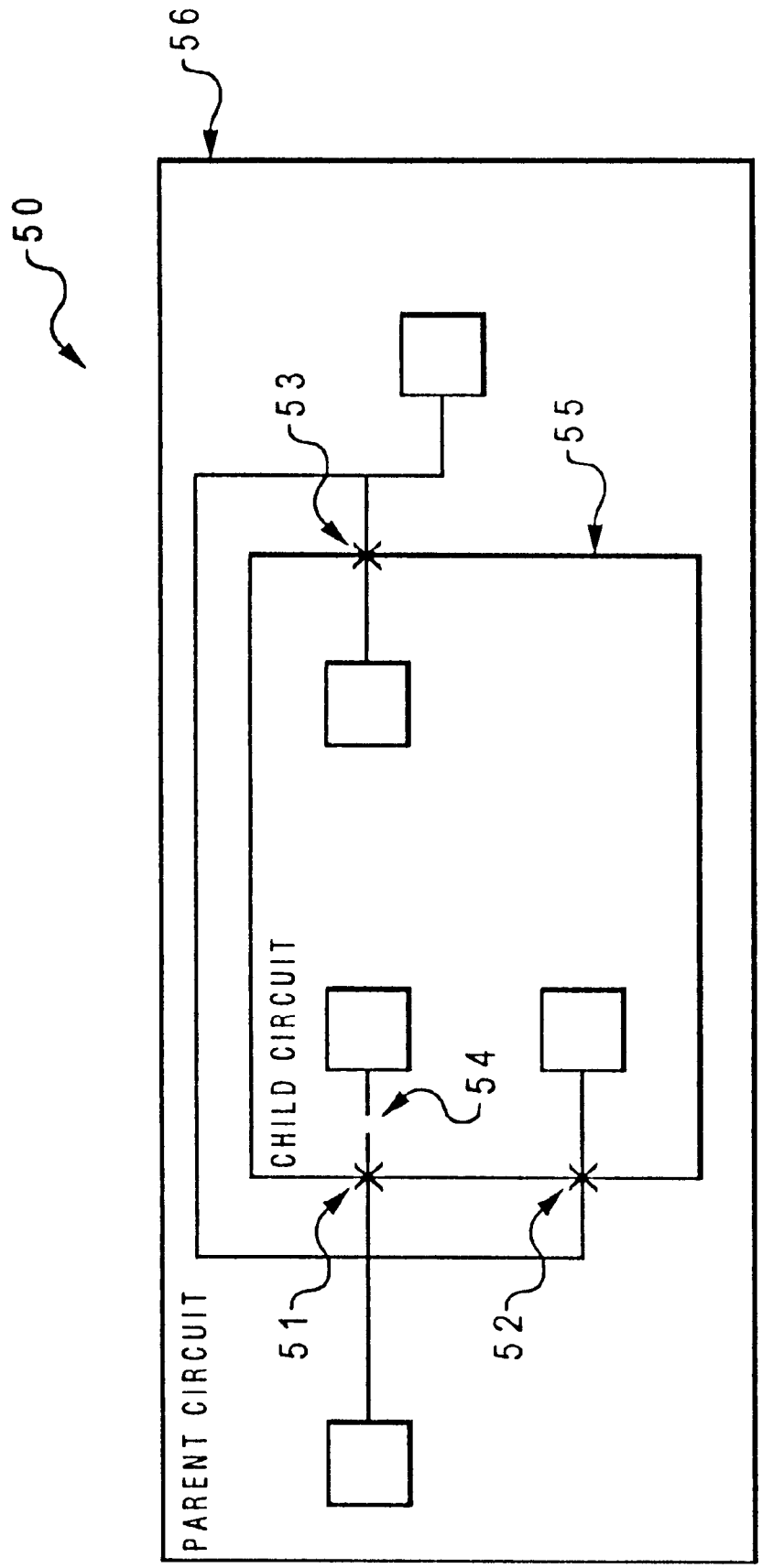
FIG. 5 is a block diagram of a net having a child circuit with a true open connection within the child circuit.

Referring now to FIG. 5, there is illustrated a block diagram of a network having a child circuit with several open circuit connections from the perspective of the child circuit. By utilizing the flagging technique described previously, a design automation system will allow open circuit connections at I/O pins 51–53 to pass. However, the "real" open connection at location 54 within child circuit 55 will be flagged properly. Open connection at location 54 is not allowed to pass because the total number of open connections in child circuit 55 is four, which is greater than the total number of I/O pins, three, in child circuit 55.

Note that design automation software checks for open connections at every level of the hierarchy. Thus, if a valid design open connection is detected in child circuit 55, another open connection check will be performed on the integrated parent circuit after child circuit 55 has been integrated into parent circuit 56. Thus, design automation system has solved a design flexibility issue without giving up any data integrity checking or its ability to process designs incrementally.

As has been described, the present invention provides an improved method of checking for open circuit connections within an integrated-circuit design that is represented by a hierarchial data structure. According to a preferred embodiment of the present invention, open circuit connections are allow to exist by design at any level of hierarchy of an IC chip design. The IC chip design may be verified in two ways: first, a circuit check is first performed in order to ensure there is no unpermissible open at each level of the circuit hierarchy; second, another circuit check is performed in order to ensure there is no open connection for the integrated-circuit.

It is also important to note that, although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of signal-bearing media include but are not limited to recordable-type media, such as floppy disks or CD ROMs, and transmission-type media such as analogue or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method of checking for open circuit connections within an integrated circuit design, said method comprising the steps of:

for an integrated circuit design having at least one parent circuit represented by a set of parent circuit level data and at least one child circuit represented by a set of child circuit level data, wherein said at least one parent circuit is at a higher hierarchial level than said at least one child circuit, determining whether or not a number of I/O pins within said at least one child circuit is greater than a number of open circuit connections specified for said at least one child circuit by a user;

presenting an error message in response to a determination that said number of I/O pins within said at least one child circuit is not greater than said number of open circuit connections specified for said at least one child circuit by said user.

2. The method according to claim 1, wherein said method further includes a step of integrating said set of child circuit level data into said set of parent circuit level data, in response to a determination that said number of I/O pins within said at least one child circuit is greater than said number of open circuit connections specified for said at least one child circuit by said user.

3. The method according to claim to 2, wherein said method further includes a step of determining whether or not said open circuit connection is closed within said integrated set of parent circuit level data.

4. the method according to claim 3, wherein said method further includes a step of presenting an error message in response to a determination that said open circuit connection is not closed within said set of integrated parent circuit level data.

5. A computer system capable of checking for open circuit connections within an integrated circuit design, said computer system comprising:

for an integrated circuit design having at least one parent circuit represented by a set of parent circuit level data and at least one child circuit represented by a set of child circuit level data, wherein said at least one parent circuit is at a higher hierarchial level than said at least one child circuit, means for determining whether or not a number of I/O pins within said at least one child circuit is greater than a number of open circuit connections specified for said at least one child circuit by a user; and means for presenting an error message in response to a determination that said number of I/O pins within said at least one child circuit is not greater than said number of open circuit connections specified for said at least one child circuit by said user is not closed within said parent circuit.

6. The computer system according to claim 5, wherein said computer system further includes a means for integrating said set of child circuit level data into said set of parent circuit level data, in response to a determination that said number of I/O pins within said at least one child circuit is greater than said number of open circuit connections specified for said at least one child circuit by said user.

7. The computer system according to claim 6, wherein said computer system further includes a means for determining whether or not said open circuit connection is closed within said integrated set of parent circuit level data.

8. The computer system according to claim 7, wherein said computer system further includes a means for presenting an error message in response to a determination that said open circuit connection is not closed within said set of integrated parent circuit level data.

9. A computer program product residing on a computer usable medium for checking for open circuit connections within an integrated circuit design, wherein said integrated circuit design is represented by at least one parent circuit level and at least one child circuit level, wherein said at least one parent circuit is at a higher hierarchial level than said at least one child circuit, said computer program product comprising:

program code means for determining whether or not a number of I/O pins within said at least one child circuit is greater than a number of open circuit connections specified for said at least one child circuit by a user; and program code means for presenting an error message in response to a determination that said number of I/O pins within said at least one child circuit is not greater than said number of open circuit connections specified for said at least one child circuit by said user is not closed within said parent circuit.

10. The computer program product according to claim 9, wherein said computer program product further includes a program code means for integrating said set of child circuit level data into said set of parent circuit level data, in response to a determination that said number of I/O pins within said at least one child circuit is greater than said number of open circuit connections specified for said at least one child circuit by said user.

11. The computer program product according to claim 10, wherein said computer program product further includes a means for determining whether or not said open circuit connection is closed within said integrated set of parent circuit level data.

12. The computer program product according to claim 11, wherein said computer program product further includes a program code means for presenting an error message in response to a determination that said open circuit connection is not closed within said set of integrated parent circuit level data.

* * * * *